United States Patent
Goldmann et al.

(10) Patent No.: US 6,458,623 B1
(45) Date of Patent: Oct. 1, 2002

(54) CONDUCTIVE ADHESIVE INTERCONNECTION WITH INSULATING POLYMER CARRIER

(75) Inventors: Lewis S. Goldmann, Bedford, NY (US); Mario J. Interrante, New Paltz, NY (US); Raymond A. Jackson, Fishkill, NY (US); Amy B. Ostrander, Wappingers Falls, NY (US); Charles H. Perry, Poughkeepsie, NY (US); Brenda L. Peterson, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,030

(22) Filed: Jan. 17, 2001

(51) Int. Cl.[7] .......................... H01L 21/44; H01L 23/48; H01L 21/48
(52) U.S. Cl. ................. 438/107; 438/106; 438/108; 438/109; 257/776; 257/777; 257/778
(58) Field of Search ............... 438/107, 106, 438/108, 109; 257/778, 779, 780, 783, 795, 792; 156/329, 330

(56) References Cited

U.S. PATENT DOCUMENTS

| | | | | |
|---|---|---|---|---|
| 5,347,162 A | * | 9/1994 | Pasch | 257/773 |
| 5,468,681 A | * | 11/1995 | Pasch | 438/108 |
| 5,489,804 A | | 2/1996 | Pasch | |
| 5,770,889 A | | 6/1998 | Rostoker et al. | |
| 5,821,624 A | | 10/1998 | Pasch | |
| 5,834,335 A | * | 11/1998 | Buschbom | 438/107 |
| 5,930,597 A | | 7/1999 | Call et al. | |
| 5,972,734 A | * | 10/1999 | Carichner et al. | 438/106 |
| 6,219,237 B1 | * | 4/2001 | Geusic et al. | 361/699 |
| 6,281,042 B1 | * | 8/2001 | Ahn et al. | 438/108 |
| 6,303,407 B1 | * | 10/2001 | Hotchkiss et al. | 438/106 |

* cited by examiner

*Primary Examiner*—Matthew Smith
*Assistant Examiner*—B V. Keshavan
(74) *Attorney, Agent, or Firm*—Delio & Peterson, LLC; James J. Cioffi

(57) ABSTRACT

A method and apparatus is provided for forming an electronic assembly whereby an insulating polymer matrix having a plurality of conductor holes is attached to a first substrate wherein the conductor holes align with a corresponding contact array on the first substrate. Subsequently, a flexible, electrically conductive adhesive is provided within the plurality of conductor holes and a solid conductive material, preferably having a high melting temperature, is attached to at least one end thereof. The insulating polymer matrix with the electrically conductive adhesive and the solid conductive material is then cured at a temperature sufficient to completely cure the matrix to completely surround the electrically conductive adhesive, as well as permanently attaching the matrix and conductive adhesive to the first substrate and permanently attaching the solid conductive material to the conductive adhesive. A second substrate may then be attached to the conductive matrix structure secured to the first substrate by providing a low melting temperature attachment means to the solid conductive material attached to the matrix and subsequently reflowing the assembly to form an electronic assembly adapted with the capability of reworkability.

29 Claims, 3 Drawing Sheets

CONDUCTIVE ADHESIVE INTERCONNECTION WITH INSULATING POLYMER CARRIER

BACKGROUND OF THE INVENTION

1. Field of the Invention

The present invention relates to electronic assemblies, and in particular, to electrically and mechanically connecting two electronic components to form an electronic assembly having reduced thermo-mechanical fatigue, while also providing the electronic assembly with the ability to use existing bond and assembly technologies in addition to providing the assembly with reworkability.

2. Description of Related Art

Forming electronic assemblies by electrically connecting two components such as a multi-layer ceramic package or circuit chip to a card, board, or another connector is well known in the art. Such multi-layer electronic assembly formation is referred to in the art as surface mount technology which can include, but is not limited to, solder join, flip chip, C4, ball grid array and pin grid array. As will be recognized, surface mount technology has gained acceptance as the preferred means of joining electronic package assemblies, particularly in high end computers.

Over the years, surface mount technology has been accomplished by a variety of techniques such as, for example, the use of interposers, soldering techniques, conductive adhesives, and the like. Prior art is directed to using thermoplastic interposers, typically a fully cross-linked high modulus material with very low compliance, having a plurality of cure stages for use in surface mount technology whereby the interposer can be positioned between any two mating surfaces having connector arrays. The interposer may be provided with holes which can be filled with solder or a conductive adhesive to connect the two substrates to the interposer. Typically, the interposer is then permanently bonded to both components through heat and pressure. However, as a result of the interposer comprising a thermoplastic polymer, the interposer is typically made of a high modulus non-compliant material which does not alleviate CTE mismatch induced strain through material movement. The adhesion of the interposer to both electronic components of the assembly typically induces a strain gradient across the interposer. In an assembly having a strong bond between the interposer and the electronic components, the interposer may influence the CTE related movement of each component and thus minimize both the difference in material movement and the strain, potentially resulting in an electronic assembly having increased working life. However, such technology relies on strong, typically permanent, bonds between the interposer and both electronic components, and thereby is not compatible with electronic assemblies requiring or desiring the ability of component reworkability.

In addition to the introduction of interposers for use in surface mount technology, numerous solder structures have been proposed for surface mounting. Typical surface mount processes form solder structures by screening solder paste onto conductive pads exposed on the surface of the first electronic substrate. The solder paste is reflowed typically in a hydrogen atmosphere and homogenizes the pad and brings the solder into a spherical shape which is then aligned to corresponding pads on the electronic structure or board to be connected thereto. After alignment, the substrate and board go through a reflow operation to melt the solder and create a solder bond between the corresponding pads on the substrate and other electronic component. However, such soldering techniques produce solder bonds of very small height leading to decreased strain absorption capability, as well as costly high temperature reflows as a result of the double reflow operations.

Semiconductor chips and multilayer ceramic or organic electronic components are also joined together by Controlled Collapse Chip Connection on a surface of one of the electronic components to corresponding pads on the surface of the other component. Controlled Collapse Chip Connection (C4) is an interconnect technology developed by IBM as an alternative to wire bonding. C4 technology provides a more exact and somewhat greater quantity of solder to be applied than can be applied through screening. In the C4 interconnect technology, a relatively small solder bump or solder ball is attached to pads on one of the components being joined, therein the conventional chip joining technology providing for semiconductor chip and ceramic or organic substrates to be attached to each other. The electrical and mechanical interconnects are then formed by positioning the corresponding pads on the other electronic component adjacent the solder bumps and reflowing the bumps at an elevated temperature. The C4 joining process is self-aligning in that the wetting action of the solder will align the chip bump pattern to the corresponding substrate pads.

Further techniques for mechanically and electrically connecting various components in surface mount technology include providing a module with a ball grid array (BGA) of solder balls In such techniques, balls of solder are arranged in a predetermined pattern on the module corresponding to a pattern of attachment pads on a substrate, typically referred to as a footprint. The solder balls of the module may then be aligned to the attachment pads of the substrate. Typically, a solder paste may be applied to the attachment pads on the substrate to provide the flux required and also cause the solder balls to adhere to the attachment pads to maintaining alignment with the solder balls during heating and reflow of the solder to form the assembly.

C4 technology (chip to substrate connection) and BGA technology (substrate to board) offer advantages of low cost, high I/O density, low inductance surface mounting interconnection, potentially smaller packages, as well as robust processing steps. However, these area array technologies are limited by strain absorption due to the allowable diameter of the solder sphere. Typically, C4 bumps are 3–5 mils in diameter while BGA solder balls are approximately 20–35 mils in diameter, whereby the size of the bump or solder ball determines the fine pitch capability, as well as the strain absorption of the interconnect with a coefficient of thermal expansion (CTE) mismatch between the chip and substrate, or substrate and board. For example, the CTE mismatch may be about 15 ppm/°C. for a glass-ceramic module on an FR-4 (fiber-reinforced epoxy) card.

During normal operations, the entire module is subject to temperature excursions due to the functioning of the circuits on the chip, resistance heating of the solder joints, the wiring within the chip, and the wiring within the substrate. This heating results in the expansion and contraction of all of these components as temperatures rise and fall. Chips are primarily comprised of silicon, which has a coefficient of thermal expansion in the range of about 3.0 ppm/°C. The corresponding substrates to which the chips are joined are typically made of ceramic or organic materials, which have coefficients of thermal expansion in the ranges of about 3 to about 7 ppm/°C. and about 12 to about 20 ppm/°C., respectively, while the corresponding printed circuit board typically has a coefficient of thermal expansion in the ranges of about 15 to about 22 ppm/°C. As a result, the chip and the substrate, and substrate and card expand and contract at different rates during thermal cycling. This mismatch places stresses on the solder joints, and over time results in the fatigue of the solder joints. Eventually, continual stress causes cracks to propagate completely across the solder joints leading to electrical failure of the electronic module.

Multilayer ceramic electronic components are also joined to printed circuit boards using high melt columns in place of the spheres which are joined to the corresponding metal pads on the surface of each component with a lower melting solder. Column grid array (CGA) technology permits greater strain absorption than conventional BGA due to the increased joint height, while simultaneously allowing the capability of finer pitch. Thus, the greater strain absorption of CGA technology provides for a more reliable and extendable electronic assembly than those assemblies formed by conventional BGA technologies. However, CGA technology is typically used on larger substrates that require an interconnection that can withstand a greater amount of strain. Furthermore, CGA adds considerable cost, electrical properties are compromised, and manufacturing complexities are increased as a result of solder columns being easily bent during handling thus requiring special precautionary measures during processing.

Prior art is also directed to the use of conductive adhesives for joining components in surface mount technology. Over the years, conductive adhesives have replaced the use of conventional soldering material, such as PbSn, in solder structures to join electronic components together in surface mount technology. However, it has been recognized that conductive adhesives are not as mechanically strong as solder joints causing failure under certain mechanical shock conditions when used as electrical interconnections. Conductive adhesive bonds, which typically have a silver filler, are not a metallurgical bond as formed by the solder joints and thus are not as strong as the solder joint bond. Further problems associated with conductive adhesive joints in electronic packaging include an increased contact resistance, oxidation of silver flakes, and silver migration may occur with temperature humidity and bias. Also, the formation of metal oxide, hydroxide, and other corrosion byproducts at the interface between a conductive adhesive and the metal bonding surface may compromise both the electrical and mechanical stability of the adhesive bonds, and thus the performance and reliability of the resultant electronic assembly.

As prior art is directed to surface mount technology for connecting two components together to form an electronic assembly including the use of interposers, soldering techniques, and conductive adhesives, such techniques have their corresponding problems as discussed above. Thus, as surface mount technology progresses, and smaller electronic assemblies are required, a need continues in the art to provide improved methods and surface mount technologies for mechanically and electrically connecting two components together to form an electronic assembly having enhanced reliability.

Bearing in mind the problems and deficiencies of the prior art, it is therefore an object of the present invention to provide an apparatus and method of connecting two components to form an electronic assembly having the structural stability of an interposer, while having greater absorption of CTE mismatch induced strain, with the exact attachment location capability as provided with BGA technologies in combination with greater strain absorption than conventional BGA technologies.

It is another object of the present invention to provide an apparatus for forming an interposer structure between two interconnected substrates of an electronic module to enhance the mechanical and electrical integrity and reliability of the module.

A further object of the invention is to provide electronic modules having solid conductive joints with enhanced mechanical strain absorption and reliability.

Another object of the present invention is to provide a circuit board capable of receiving different chip modules at each chip module receiving site.

It is yet another object of the present invention to provide an electronic component assembly or module made using the method and apparatus of the invention.

Another object of the invention is to provide improved surface mount technology for use in connecting smaller multi-chip modules having structural stability with greater strain absorption for a more reliable electronic assembly.

Still another object of the present invention is to provide an electronic component assembly or module having reducing silver migration.

It is another object of the present invention to provide a circuit board which provides reworkability between the joined substrates.

Yet another object of the present invention is to provide an electronic component assembly having reduced thermo-mechanical fatigue.

Another object of the invention is to provide an electronic component assembly with the ability to use existing bond and assembly technologies.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for electrically connecting two components by providing an insulating matrix with a plurality of conductor holes. Preferably, the insulating matrix comprises a polymer insulating matrix with the plurality of conductor holes formed in the insulating matrix to match corresponding contact arrays of the first and second substrates on first and second surfaces of the insulating matrix. The plurality of conductor holes may be formed by laser ablation, mechanical punching, drilling, or may be provided within the insulating matrix as-formed by injection molding or transfer molding techniques.

The insulating matrix may comprise a low modulus insulating matrix comprising a low modulus material selected from the group consisting of silicone, silicone epoxy, urethane, and flexible epoxy. Alternatively, insulating matrix may comprise a high modulus insulating matrix comprising a high modulus material selected from the group consisting of epoxy, polysulfone, and polyimide siloxane. The insulating matrix may also comprise a B-staged thermoset insulating matrix or a thermoplastic insulating matrix. The insulating matrix may then be aligned with the first substrate, whereby the plurality of conductor holes on a first side of the matrix align with contact arrays on the first substrate.

A conductive material, preferably a conductive adhesive, is then provided within the plurality of conductor holes. By providing the conductive material into the conductor holes in the matrix, the insulating matrix provides structural support to the conductive material within the plurality of conductor holes. The conductive material may comprise a flexible, low modulus conductive adhesive, or a high modulus conductive adhesive. In the present invention, preferably the insulating matrix and the conductive adhesive comprise similar materials thereby the conductive adhesive absorbing a CTE mismatch strain of the electronic assembly.

Subsequently, a solid conductive material is attached to an end of the conductive adhesive within the conductor holes in the insulating matrix. Preferably the solid conductive material comprises a solid conductive metal material. In the present invention, the solid conductive metal material may comprise copper, brass, nickel, tin, gold, lead, and combinations thereof. Furthermore, the solid conductive metal material may be a variety of contacts including a pin, cone, stud, ball, and disk. In attaching the solid conductive material to the conductive adhesive a portion of the solid conductive material may be provided within the plurality of conductor holes in the matrix. In the preferred embodiment, the a portion of about 25% to about 75% of the solid conductive material may be provided within the plurality of conductor holes.

Once the solid conductive material is positioned in alignment with the conductive adhesive, a conductive matrix structure is then formed. The conductive matrix structure comprises the insulating matrix completely surrounding the conductive adhesive which has attached thereto the solid conductive material. The conductive matrix structure may then be permanently secured to the first substrate by heating the conductive matrix structure to a temperature sufficient to completely cure the conductive matrix structure and permanently bond the same to the first substrate.

After the conductive matrix structure is permanently secured to the first substrate, the connection of the resultant assembly adapted with reworkability may be formed by connecting the structure to a second substrate. The first substrate having attached thereto the insulating matrix with the solid conductive material attached to the conductive material may be secured to the second substrate by an attachment means which adapts the resultant electronic assembly with reworkability. In the preferred embodiment of the present invention, the attachment means comprises a solder material which adapts the resultant electronic assembly with reworkability while simultaneously maintaining substrate integrity.

In yet a further aspect, the present invention is directed to an electronic assembly made by the method as described above and further below.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
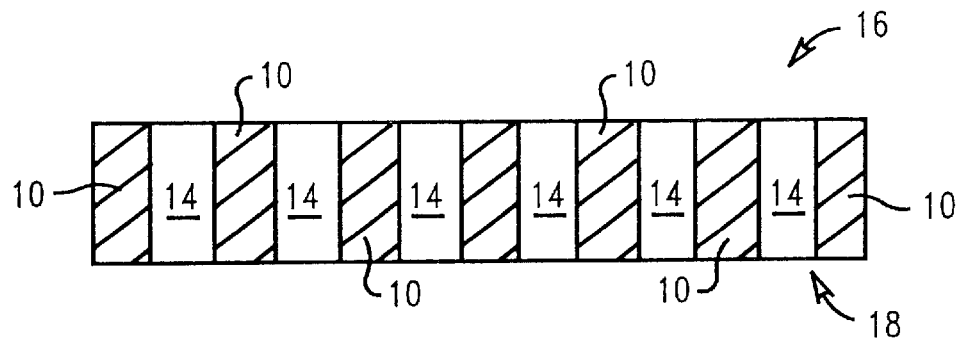
FIG. 1A is a cross sectional view of an insulating matrix of the present invention having a plurality of conductor holes traversing therethrough wherein the conductor holes are provided vertically to a horizontal planar surface of the matrix.

In describing the preferred embodiment of the present invention, reference will be made herein to FIGS. 1–6 of the drawings in which like numerals refer to like features of the invention. Features of the invention are not necessarily shown to scale in the drawings.

Manufacturers of printed circuit boards typically have to work with a selection of chip modules having different configurations of electrical connectors as well as different arrangements of the electrical connector footprints for connection to the corresponding contacts on the printed circuit boards. As used herein, the terms "contact arrangement" or "connector arrangement" refers to the pattern of the individual connectors or contacts, including the number and location of such contacts or connectors. As used herein, the term "contact configuration" or "connector configuration" refers to the type of physical and electrical connector utilized between the chip module and the printed circuit board, for example, pin grid arrays (PGA), ball grid arrays (BGA), micro BGAs (denser than typical BGAs), column grid arrays (CGA) or direct die attachment. As used herein and above, the terms "reworkability," "reworked," or "rework" refer to the ability of disassembling, removing, disconnecting, and/or separating two components from each other, while maintaining component integrity, for subsequent reattachment of at least one of such components to another component.

The present invention discloses a method and apparatus for connecting two substrates together to form an electronic assembly using an electrically conductive adhesive enclosed within an insulating polymer matrix, wherein the matrix is permanently bonded to a first substrate with the electrically conductive adhesive bonded to the electrical contacts on the first substrate, while the electrically conductive adhesive on the second side of the matrix is directly attached to a solid conductive material for attaching the matrix to a second substrate. Preferably the electrically conductive adhesive is an uncured electrically conductive adhesive, even more preferably an uncured electrically conductive adhesive paste, which is then cured in contact with the first substrate, insulating matrix and solid conductive material.

In forming the present electronic assembly, the insulating polymer matrix is provided with a plurality of through-holes which are filled with the electrically conductive adhesive, thereby the matrix completely enclosing and surrounding the electrically conductive adhesive. In the preferred embodiment, the insulating polymer matrix encasing the electrically conductive adhesive is permanently secured on only one side of the matrix to a first substrate. The second side of the matrix is attached to a second substrate, wherein the attachment is adapted with the ability to be reworked. In doing so, a solid conductive material is attached to the electrically conductive adhesive which is exposed on the second side of the matrix. The electrically conductive adhesive is completely enclosed within the matrix, thereby preventing and/or avoiding oxidation of the electrically conductive adhesive from the environment outside the insulating matrix. The solid conductive material is then secured directly to the second substrate by an electrically conductive attachment means as known and used in the art, preferably by an electrically conductive eutectic solder thereby securing the matrix to the second substrate to mechanically and electrically form the electronic assembly. Thus, the electronic assembly formed is provided with the ability to be reworked on one side of the assembly. In the present invention, reworkability is desired on only one side of the assembly to facilitate removal of the module and all interconnecting materials used to form the assembly during the rework process. In an alternate embodiment, the resultant electronic assembly may be provided with reworkability on both sides of such assembly in accordance with the steps of the present invention for providing an assembly with reworkability.

The present invention will be better understood by the description of the preferred embodiment below and the illustrations in FIGS. 1–6. In the preferred embodiment of forming the electronic assemblies of the present invention, first and second substrates are provided for making a connection between the two substrates to form the resultant electronic assembly. In forming the electronic assembly, the first substrate may comprise a multi-layer ceramic package, organic package, and the like; while the second substrate may comprise a card, board, another connector, and the like. In the present invention, the first and second substrates may be provided with similar contact or connector arrangements as well as similar contact or connector configurations of their corresponding connection array pads. Alternatively, the first and second substrates may be provided with differing contact or connector arrangements, as well as differing contact or connector configurations of their corresponding connection array pads.

In connecting the first and second substrates in the present invention, an insulating matrix 10, having a first surface 16 and a second surface 18, is provided for positioning therebetween the first and second substrates. See FIGS. 1A–B. The insulating matrix 10 is further provided with a plurality of conductor holes 14 whereby the insulating matrix 10 provides structural and/or mechanical support to a flexible, electrically conductive adhesive which is provided into the conductor holes 14 in the matrix. In the preferred embodiment, the insulating matrix 10 preferably comprises an insulating polymer carrier comprising a low modulus material having a modulus ranging from about 100 psi to about 100,000 psi, more preferably ranging from about 500 psi to about 25,000 psi, including low modulus thermoset materials including silicone, silicone epoxy, urethane, flexible epoxy, and the like, or alternatively low modulus thermo plastic materials including epoxy, polysulfone, polyimide siloxane, and the like, whereby the material selected has mechanical properties similar to the polymer material of the flexible, electrically conductive adhesive provided subsequently into the conductor holes within the insulating matrix. The insulating matrix of the present invention may be formed by conventional techniques as known and used in the art including, for example, injection molding or transfer molding with the plurality of holes formed during fabrication, or alternatively forming a solid insulating matrix and subsequently forming the holes in the matrix by mechanical or laser drilling of the solid matrix, or other known techniques used in the art. The insulating matrix may preferably be formed to a thickness ranging from about 2.5 mm to about 0.1 mm. However, as will be recognized by one skilled in the art, the thickness and the insulating matrix material may be varied according to known thicknesses and materials for achieving a desired level of adhesion to a substrate or alternatively to influence the strain absorption.

Preferably, the low modulus polymer material of the insulating matrix comprises a partially curable, or "B Stage" cure, polymer thermoset material wherein the polymer material is cured to a sufficient point at which the insulating matrix is able to be handled and processed without being completely cured. In using a partial cure or "B Stage" cure polymer material for forming the insulating matrix of the invention, the matrix may be subsequently provided with a plurality of holes 14 corresponding to receiving pads, i.e. contact or connector arrangements and configurations on their corresponding connection array pads, on the first and second substrates for forming the electronic assemblies of the invention. See FIGS. 1A–B. Furthermore, the low modulus polymer insulating matrix material of the present invention preferably does not require metal fillers for conductivity as it is preferably the insulating portion of the resultant electronic assembly.

Figure 1B:
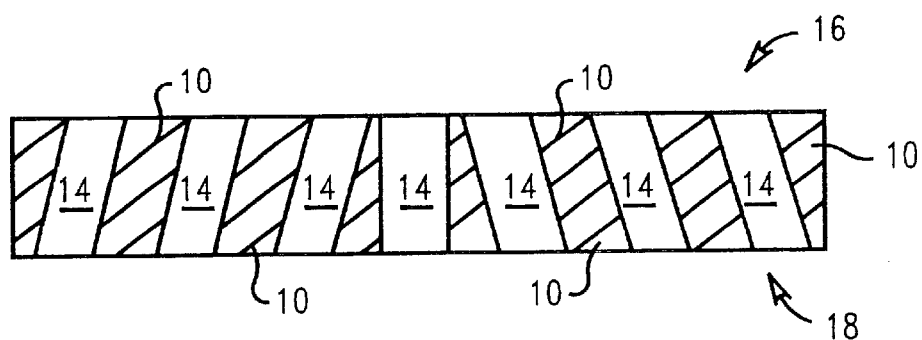
FIG. 1B is a cross sectional view of an alternate embodiment of the insulating matrix of the present invention having a plurality of conductor holes wherein the conductor holes traverse therethrough the matrix at a variety of angles.
Figure 2:
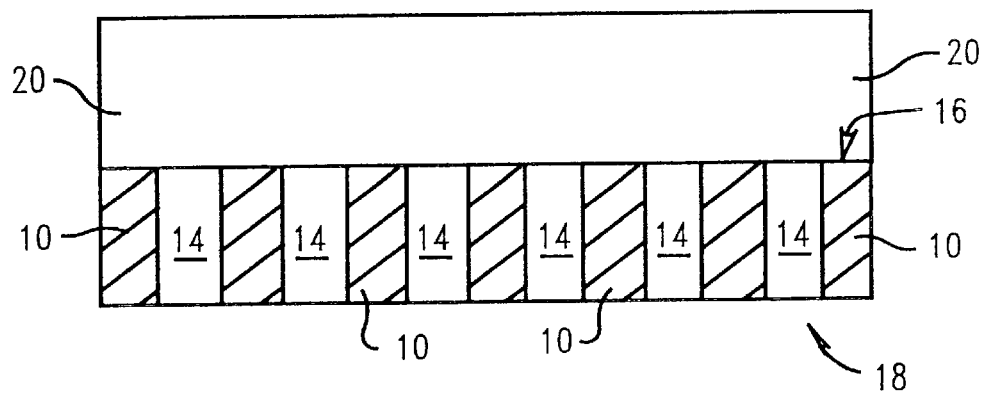
FIG. 2 is a cross sectional view of the insulating matrix of FIG. 1A attached to a first substrate on a first surface of the matrix.

In the embodiment wherein the insulating matrix 10 has been formed as a solid matrix, the insulating matrix may subsequently be provided with the plurality of holes 14 which traverse therethrough the insulating matrix 10 as illustrated in FIGS. 1A–B. The plurality of holes may be formed by conventional techniques including, laser ablation, mechanical punching, drilling, and the like to a variety of diameters including for example, to diameters ranging from about 10 mils to about 35 mils. The use of the partially curable, "B Stage" state material of the insulating matrix allows the matrix to be easily provided with the plurality of conductor holes 14. As illustrated in FIGS. 1A–B, in forming the plurality of conductor holes, the holes traverse through the matrix in an array corresponding to matching receiving connection array pads, having similar, or alternatively differing, contact or connector arrangements and configurations, on the attachment surfaces of both the first and second substrates. Thus, the plurality of conductor holes 14 may be formed vertically in relation to the planar, horizontal surfaces of the matrix 10, or may be provided at a variety of angles as illustrated in FIG. 1B, and still further, the plurality of holes may be provided in shapes, patterns, and angles as known and used in the art of forming electronic assemblies wherein a first component for forming the assembly may have different configurations of electrical connectors as well as different arrangements of the electrical connector footprints for connection to the corresponding contacts on the second component of the resultant assembly. Alternatively, the insulating matrix 10 may be provided with the plurality of holes 14 as-formed as discussed above by techniques as known and used in the art.

In the preferred embodiment, the holes in the partially cured polymer matrix 10 may be punched in an array and configuration matching the contact array and configuration on a bottom surface of a chip carrier package to a corresponding contact array and configuration on an organic card such as fiberglass reinforced epoxy, for example. See FIGS. 1A–B, and 6. As discussed above, the contact arrays may be the same on the first and second substrates, or alternatively the first and second substrates may having differing contact connection arrays and configurations, therein requiring the conductor holes 14 within the insulating polymer matrix 10 to be formed in a variety of shapes, diameters, angles, and the like.

Alternatively, the insulating matrix may comprise an insulating matrix directly and permanently attached to the first substrate as-formed. In such an embodiment, the insulating matrix may comprise a material including silicone, urethane, silicone epoxy, and the like, whereby the insulating matrix is formed by techniques as known and used in the art including injection molding or transfer molding techniques. In forming such an insulating matrix, the first substrate may be incorporated into the molding operation whereby the insulating matrix material is provided over the substrate whereby the matrix, preferably having the plurality of conductor holes as-formed or as-molded, is formed over the first substrate and then cured to directly and permanently attach the insulating matrix onto the first substrate of the electronic assembly.

Alternatively, the insulating matrix of the present embodiment may be made by an injection molding or transfer molding techniques and subsequently applied to the first substrate with the plurality of holes aligned with the connection contact array on the bottom of the first substrate using an insulating adhesive such as room-temperature vulcanizer, epoxy, and the like. In such an embodiment, the insulating adhesive material may be fully cured prior to addition of the conductive adhesive into the system, or alternatively it may be left uncured yet tacky for mechanical adhesion of the insulating matrix.

In the preferred embodiment, after the conductor holes 14 have been provided within the B staged insulating polymer matrix 10, the insulating matrix is attached to the first substrate 20. Preferably, the B staged insulating polymer matrix 10 is first positioned or aligned with the first substrate 20 by known techniques wherein the plurality of holes 14 are aligned to the connection contact array on a bottom surface of the first substrate. More preferably, the B staged insulating polymer matrix 10 is aligned with a chip carrier package wherein the plurality of holes 14 are aligned to the connection contact array on a bottom surface of the chip carrier package. The B staged insulating matrix may be heated to a temperature ranging from about 70°C. to about 250°C., or alternatively to a temperature sufficient to affect full cure of B staged insulating polymer matrix 10 thereby permanently attaching the insulating polymer matrix 10 to the first substrate, and subsequently providing the conductive adhesive and a solid conductive material attached thereto the adhesive and further curing the matrix. However, in the preferred embodiment, the B-staged insulating matrix is not fully cured until the conductive adhesive and a solid conductive material have been attached thereto at least one end of the conductive adhesive within the holes in the matrix.

Figure 3:
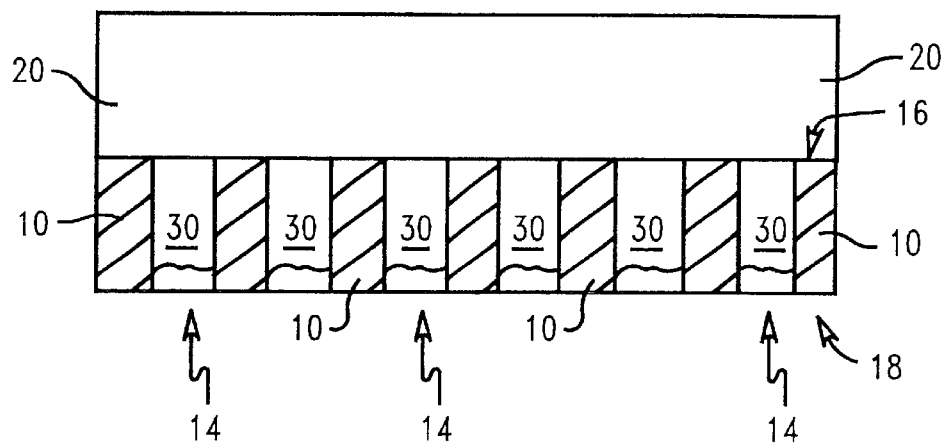
FIG. 3 is a cross sectional view of the insulating matrix of FIG. 2 attached to the first substrate having a flexible, electrically conductive adhesive provided therein the plurality of conductor holes.
Figure 4:
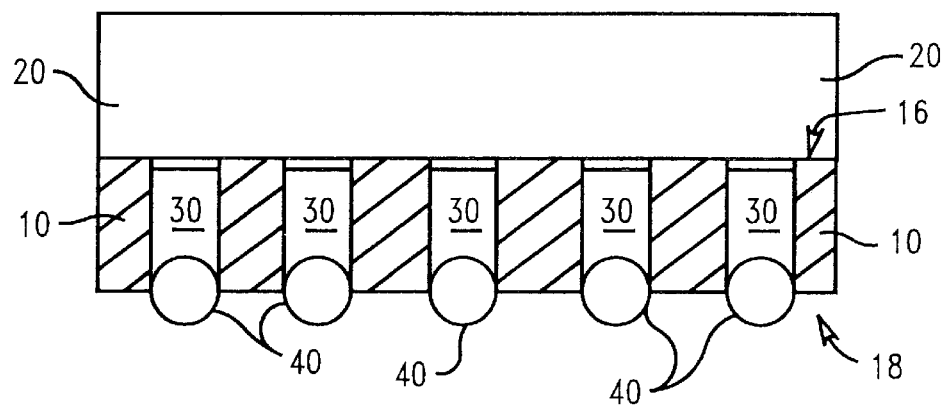
FIG. 4 is a cross sectional view of the insulating matrix of FIG. 3 having a solid conductive material, such as a solder ball, attached to the flexible, electrically conductive adhesive on a second surface of the matrix wherein the conductive matrix structure is cured to permanently attach the conductive matrix structure to the first substrate.

In the preferred embodiment of the present invention, as illustrated in FIGS. 3–4, the B staged insulating polymer matrix 10 is aligned to the connection array on the first substrate, then filled with the electrically conductive adhesive, next provided with a solid conductive material which is attached directly to the second end of the electrically conductive adhesive within the holes 14 on the second side of the matrix, and subsequently fully cured. See FIG. 3. The plurality of conductor holes may be filled with a flexible, electrically conductive adhesive having substantially the same modulus as the material of the insulating matrix. In the preferred embodiment, both the insulating matrix and the conductive adhesive comprise substantially similar low modulus materials having mechanical properties similar to each other wherein both preferably have a modulus ranging from about 100 psi to about 100,000 psi, more preferably ranging from about 500 psi to about 25,000 psi. The flexible conductive adhesive may comprise a low modulus material including silicone, silicone epoxy, epoxy, urethane, and the like. Therein, the low modulus material of the insulating matrix permits the CTE mismatch generated strain of the resultant assembly to be taken up by the flexibility of the low modulus conductive adhesive, thereby not transferring strain to the second substrate, such as a card-side solder joint. The flexibility of both the conductive adhesive and insulating matrix permit the interconnect assembly to move corresponding to the expansion and contraction of the joined substrates. With the flexible materials, the stain energy is by material movement and fractures are not induced in the material or in the card-side joint. Thus, the low modulus of both the flexible, electrically conductive adhesive and the insulating matrix of the present invention corresponds to increased compliance, flexibility, and enhanced reliability of the resultant assembly.

In an alternative embodiment, both the insulating matrix and the flexible, electrically conductive adhesive comprise substantially similar high modulus materials having mechanical properties similar to each other wherein both preferably have a modulus ranging from about 100,000 psi to about 2,000,000 psi, more preferably ranging from about 750,000 psi to about 1,250,000 psi. In such an embodiment, the insulating matrix and the electrically conductive adhesive may comprise material including epoxies, polyimides, and the like. In the present invention, in using high modulus materials for both the insulating matrix and the electrically conductive adhesive provides the resultant electronic assembly with enhanced reliability through the strong bonding of the high modulus materials, to form a composite surface with graded CTE thereby reducing overall mismatch between components. In doing so, the high modulus materials of both the insulating matrix and the adhesive provides strong bonds between the matrix and the first substrate, the matrix and the conductive adhesive, and the conductive adhesive and the solid conductive material attached thereto while providing the resultant assembly with the capability of reworkability. In attaching a second substrate to the solid conductive material an attachment means is used wherein the attachment means has a lower melting point temperature in comparison to the solid conductive material. Thus, the use of high modulus materials of both the matrix and the adhesive in the present invention provides the assembly with stronger bonds in comparison to lower modulus materials to further diminish the CTE mismatch between the first and second substrates, such as a chip to a substrate, or a substrate to a card or board. Further, in using a high modulus conductive adhesive having a higher adhesive strength, the amount of high modulus conductive adhesive used can be adjusted to accommodate the strain imparted on the substrates.

In yet another embodiment of the present invention, the insulating matrix and the flexible, electrically conductive adhesive may comprise combinations of the high modulus materials and the low modulus materials as described above. Thus, the matrix may comprise a low modulus insulating matrix while the electrically conductive adhesive comprises a high modulus electrically conductive adhesive. Alternatively, the matrix may comprise a high modulus insulating matrix while the flexible, electrically conductive adhesive comprises a low modulus flexible, electrically conductive adhesive. In such embodiments, the resultant assembly is still provided with the advantage of reworkability as the second substrate is attached to the solid conductive material via an attachment means which is easily removed, therein easily separating and/or detaching the second substrate from the combination of the matrix permanently attached to the first substrate while maintaining the component integrity. Such an embodiment provides the advantages of enhanced moisture resistance, adhesion, thermal stability, as well as enhanced reliability of the resultant assembly.

As illustrated in FIG. 4, preferably the conductive adhesive 30 material may be provided within the plurality of conductor hole 14 in the insulating polymer matrix 10 by techniques as known and used in the art including, for example, screening or dispensing the conductive adhesive material into the holes 14. The conductive adhesive material 30 may be provided within the plurality of conductor holes 14 to at least fill the holes 14, or in a sufficient amount which leaves enough space for a solid conductive material to be subsequently positioned within a portion of the conductor holes 14 to directly contact the conductive adhesive 30 and sidewalls of the holes, thereby plugging the conductor holes 14 on the second surface 18 of the matrix 10. See FIG. 4. Wherein the conductive adhesive material fills the conductor holes 14 and extends over the second surface thereof, the surface of the matrix may be cleaned of the excess conductive adhesive 30 by techniques as known and used in the art, including mechanical cleaning, for example. In the present invention, the insulating matrix 10 both protects the conductive adhesive from the environment outside the insulating matrix, as well as provides structural support to the conductive adhesive which is bonded directly to a contact array on a first substrate on the first surface 16 of the insulating matrix 10 and the solid conductive material on the second surface 18 of the insulating matrix 10.

Figure 5:
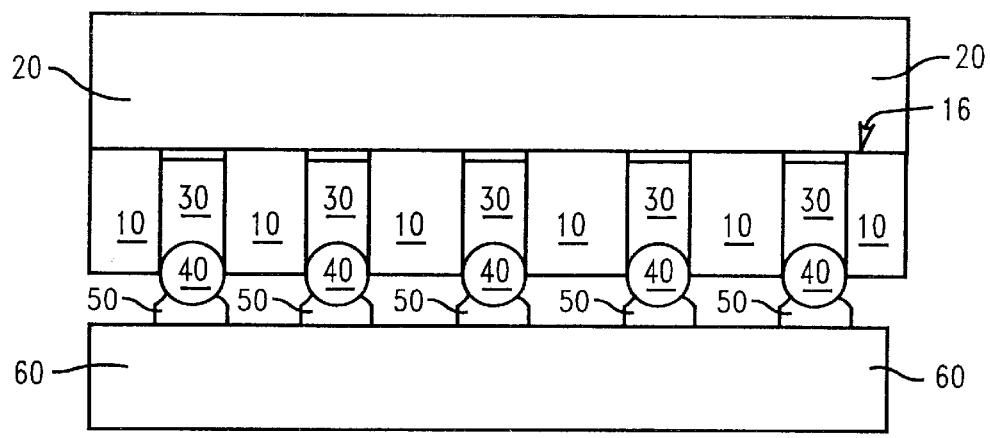
FIG. 5 is a cross sectional view of the insulating matrix of FIG. 4 wherein the combined conductive matrix structure permanently attached to the first substrate is then attached to a second substrate using an attachment means, such as a eutectic solder, which provides the resultant assembly with the ability to be reworked.
Figure 6:
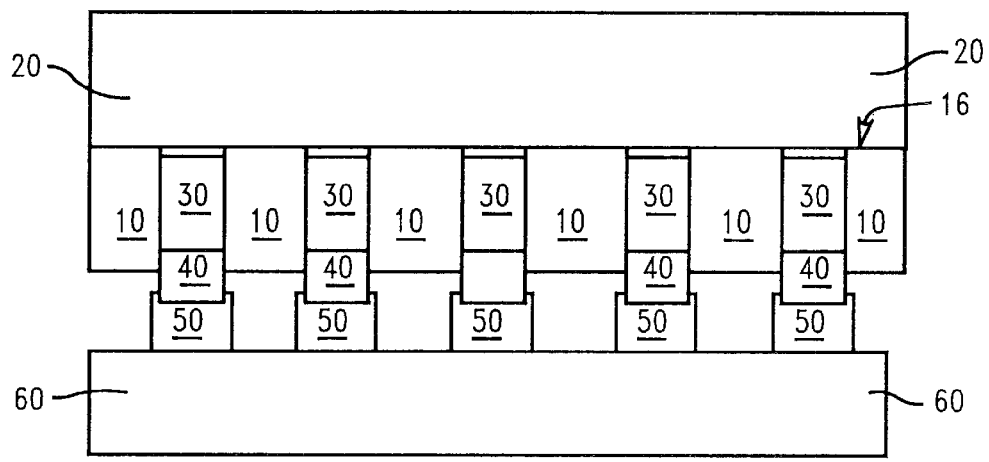
FIG. 6 is a cross sectional view of an alternate embodiment of the present electronic assembly wherein the solid conductive material comprises a plug which is secured to the second substrate by a solder to form the resultant assembly provided with reworkability.

Subsequently, as illustrated in FIGS. 4–6, a solid conductive material 40, such as a metal conductive material, is positioned within the conductor holes 14 on the second surface 18 of the matrix 10 such that a portion of about 25% to about 75%, preferably about 40% to about 60% of the solid conductive material 40 directly contacts the conductive adhesive 30 within the conductor holes 14 in the insulating matrix 10. Thereby, that portion of the solid conductive material 40 inserted into the holes 14 fills any gaps between the conductive adhesive 30, the insulating matrix 10, and the solid conductive material 40 as illustrated in FIGS. 4–6. Preferably, the solid conductive material 40 is placed in direct contact with the conductive adhesive prior to completely curing the B-staged matrix to permanently bond the matrix to the first substrate. In providing a portion of the solid conductive material 40 within the conductor holes 14, the resultant electronic assembly is provided with enhanced reliability, while maintaining standard processing capabilities. Alternatively, the solid conductive material 40 may be flush with the bottom surface of the matrix thereby plugging the plurality of conductor holes, thus not extending within the plurality of conductor holes.

In the present invention, the solid conductive material 40 may comprise a variety of metal materials including solder, copper, brass, lead, tin, PbSn alloys, and the like, as well as a variety of metal shapes including a ball as illustrated in FIGS. 4–5, a disk as illustrated in FIG. 6, a stud, a pin, a cone, and the like. Preferably, the solid conductive material 40 comprises a solder material which is positioned into the conductor holes to a depth ranging from about 2 mils to about 30 mils, thereby the insulating matrix completely surrounding the preferred flexible, electrically conductive adhesive, as well as portions of the solder material which is directly in contact with the conductive adhesive. More preferably, the solid conductive material 40 comprises either pure lead, or alternatively a solder termed a binary solder having a high melting point which is higher in comparison to a melting point temperature of an attachment means for joining the conductive matrix structure to a second substrate in a subsequent step. A specific alloy which is preferred because of its demonstrated effectiveness is a solder contains about 10% by weight tin and the balance, about 90%, essentially lead. In connecting or securing the solid solder material to the conductive adhesive, the solid solder is attached directly to the conductive adhesive. Thus, in the preferred embodiment, a suitable electrical path is formed in the conductor holes 14 of the insulating matrix to electrically interconnect a chip carrier package to a organic card, for example.

Alternatively, the solid conductive material 40 may comprise a shape and size corresponding to the shape, size and diameter of the conductor holes on the second surface of the insulating matrix. Furthermore, in attaching the solid conductive material 40 to the conductive adhesive 30 within the conductor holes 14 in the insulating matrix 10, some of the conductive adhesive 30 within the conductor holes may be displaced outside of the conductor holes onto the second surface 18 of the matrix 10, thus requiring cleaning of the matrix surface by techniques such as mechanical cleaning prior to fully curing the matrix 10. Also, when positioning the solid conductive material 40 into direct contact with the conductive adhesive, the conductive adhesive may further be displaced thereby ensuring filling of any gaps between the solid conductive material, adhesive, and walls of conductor holes within the insulating matrix.

Subsequently, the B-staged insulating matrix, having the completely enclosed flexible, electrically conductive adhesive in direct contact with the solid solder material, which may be partially positioned within the conductor holes, may then be completely cured to at a temperature ranging from about 70°C. to about 250°C. Alternatively, a temperature sufficient to affect full cure of the B staged insulating polymer matrix 10 may be selected by known techniques and the matrix cured at such temperature. In completely curing the B staged insulating polymer matrix, a permanent chemical bond is provided directly between the insulating matrix 10 and the first substrate 20 as well as between the insulating matrix 10 and conductive adhesive 30 and the solid conductive material 40, thereby the insulating matrix attaching to the non-metallic portions of the substrate, or non-contact array portions of the first substrate. In the embodiment wherein the insulating matrix material is already in the cured state, a room temperature vulcanizer or epoxy adhesive may be cured at a temperature ranging form about 25°C. to about 250°C.

In the present invention, wherein the temperature for completely curing the insulating matrix adhesion is above 70°C., the conductive adhesive material may be cured simultaneously in the same cure process. Alternatively, the conductive adhesive may be cured in a separate cure step at a temperature ranging from about 70°C. to about 250°C. Furthermore, in the present invention, in addition to the step of fully curing the insulating matrix to bond the matrix to the contact array of the first substrate, the step of fully curing the insulating matrix also confines the conductive adhesive in individual conductor holes, or connector holes, to reduce the possibility of electro-migration, such as the electro-migration of Ag containing conductive adhesives. In the preferred embodiment, the insulating matrix, and conductive adhesive in combination with the solder material, are fully cured at the same time, thereby confining the conductive adhesive in individual conductor holes to reduce the possibility of electro-migration, such as the electro-migration of Ag containing conductive adhesives. Furthermore, the one step curing of the matrix in combination with the conductive adhesive and the solid conductive material attached thereto enhances the best interface to the connection contacts in the first and second substrates.

After the conductive matrix structure, comprising the insulating matrix surrounding the conductive adhesive having the solid conductive material attached thereto, is attached to the first substrate, the conductive matrix structure may then be treated as a BGA type module and conventional joining processes may then be used to form the resultant electronic assembly. Thus, the solid conductive material of the present invention comprises a part of the conductive adhesive within the insulating matrix thereby permitting the card assembly process to remain unchanged while also maintaining handle-ability. In forming the resultant electronic assembly of the present invention, an attachment means 50, which adapts the assembly with the capability of reworkability, is provided therebetween the solid conductive material 40 and a second substrate 60. See FIGS. 5–6. The attachment means 50 may comprise a variety of materials as known and used in the art including a eutectic solder, low melt solders including Sn/Pb, preferably 63/37 Sn/Pb, Sn/Ag, Sn/Ag/Cu, Sn/Sb, Sn/Ag/Bi, and the like. Preferably the material selected for the attachment means has a melting point lower than the melting point of the solid conductive material used in forming the electronic assembly. The attachment means 50 is provided to an exposed portion of the solid conductive material 40 and positioned and/or aligned to the contact array on a surface of the second substrate 60. Subsequently, the attachment means 50 may be secured to the second substrate by techniques known and used in the art including reflowing, and the like to provide the resultant electronic assembly of the present invention adapted with the ability to be reworked. In the present invention, the conductive matrix structure may comprise a thermoplastic insulating matrix or alternatively a thermoset insulating matrix whereby the conductive matrix structure may be attached to the first substrate by techniques including injection molding, transfer molding, deposition of organics onto the substrate, or adhering with a non-conductive adhesive, such as Room Temperature Vulcanizer (RTV). As will be recognized, in the present invention the length, diameter, and/or material of the conductive adhesive may be altered to achieve desired adhesion and/or strain absorption properties. Further, wherein the solid conductive material preferably comprises a metal material, the material may be changed metallurgically for contact resistance purposes, as well as changing the size and/or shape of the solid conductive material for electrical and/or mechanical properties.

The present invention discloses an apparatus and method of using conductive adhesive encapsulated by a polymer insulating matrix, as an interconnection between a chip and substrate or substrate and card wherein the conductive adhesive has a solid conductive material attached to an end thereof for providing the resultant assembly with reworkability. In this invention, use of an insulating polymer matrix or carrier, imparts structural support to the conductive adhesive bond while also protecting the conductive adhesive from the environment outside the matrix to avoid oxidation and thereby preventing silver migration into the insulating polymer matrix. Thus, the present invention avoids the problems associated silver migration to adjacent contacts. Furthermore, the use of a flexible conductive adhesive completely enclosed within an insulating polymer matrix as an interconnection permits improved absorption of the strain from thermal expansion mismatch between materials over conventional BGA technology, without the added manufacturing complexities and handling issues associated with conventional CGA technology, thereby extending the lifetime and/or application space of components. Thus, the present invention combines the advantages of BGA processing with CGA reliability. In the present invention, the resultant assembly is provided with reduced thermo-mechanical fatigue, while also providing the electronic assembly with the ability to use existing bond and assembly technologies in addition to providing the assembly with the ability to be reworked.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for electrically connecting two components comprising:
   a) providing an insulating matrix;
   b) providing a plurality of conductor holes in said insulating matrix;
   c) depositing a conductive material in said plurality of conductor holes;
   d) attaching a solid conductive material to said conductive material in said plurality of conductor holes;
   e) securing said insulating matrix having said solid conductive material attached to said conductive material within said plurality of conductor holes to first and second substrates to form an electronic assembly;
   f) heating said insulating matrix having said solid conductive material attached to said conductive material within said plurality of conductor holes to a temperature to secure said insulating matrix having said solid conductive material attached to said conductive material within said plurality of conductor holes to said first substrate; and
   g) securing said first substrate having attached thereto said insulating matrix with said solid conductive material attached to said conductive material to said second substrate by providing an attachment means between said solid conductive material and contact arrays of said second substrate, wherein said attachment means adapts said electronic assembly with the ability to be disassembled while simultaneously maintaining substrate integrity.

2. The method according to claim 1 wherein said insulating matrix comprises a polymer insulating matrix.

3. The method according to claim 1 wherein said plurality of conductor holes are formed in said insulating matrix to match corresponding contact arrays of said first and second substrates on first and second surfaces of said insulating matrix.

4. The method according to claim 3 wherein said contact arrays of said first and second substrates have differing contact arrangements and configurations.

5. The method according to claim 1 wherein said insulating matrix provides structural support to said conductive material within said plurality of conductor holes in said insulating matrix.

6. The method according to claim 1 wherein said solid conductive material comprises a solid conductive metal material.

7. The method according to claim 6 wherein said solid conductive metal material comprises a metal selected from the group consisting of copper, brass, nickel, tin, gold, lead, and combinations thereof.

8. The method according to claim 1 wherein said solid conductive material comprises a contact selected from the group consisting of a pin, cone, stud, ball, and disk.

9. The method according to claim 1 wherein said conductive material is a flexible, conductive adhesive.

10. A method for electrically connecting two components comprising:
   a) providing an insulating matrix;
   b) providing a plurality of conductor holes in said insulating matrix;
   c) aligning said insulating matrix having said plurality of conductor holes to a first substrate;
   d) depositing a conductive adhesive in said plurality of conductor holes;
   e) attaching a solid conductive material to said conductive adhesive in said plurality of conductor holes;
   f) forming a conductive matrix structure by heating said insulating matrix having said solid conductive material attached to said conductive material within said plurality of conductor holes to a temperature to secure said insulating matrix having said solid conductive material attached to said conductive material within said plurality of conductor holes to said first substrate; and
   g) forming an electronic assembly by attaching said conductive matrix structure to a second substrate by an attachment means wherein said attachment means provides said electronic assembly with reworkability.

11. The method according to claim 10 wherein said insulating matrix comprises a low modulus insulating matrix.

12. The method according to claim 11 wherein said low modulus insulating matrix comprises a low modulus material selected from the group consisting of silicone, silicone epoxy, urethane, and flexible epoxy.

13. The method according to claim 10 wherein said insulating matrix comprises a high modulus insulating matrix.

14. The method according to claim 13 wherein said high modulus insulating matrix comprises a high modulus material selected from the group consisting of epoxy, polysulfone, and polyimide siloxane.

15. The method according to claim 10 wherein said insulating matrix comprises a B-staged insulating matrix.

16. The method according to claim 10 wherein said insulating matrix comprises a thermoplastic insulating matrix.

17. The method according to claim 10 wherein said plurality of conductor holes are formed in said insulating matrix by hole punching to match corresponding contact arrays of said first and second substrates on first and second surfaces of said insulating matrix.

18. The method according to claim 10 wherein said conductive adhesive is a flexible, low modulus conductive adhesive.

19. The method according to claim 10 wherein said conductive adhesive is a high modulus conductive adhesive.

20. The method according to claim 10 wherein said insulating matrix and said conductive adhesive comprise similar materials thereby the conductive adhesive absorbing a CTE mismatch strain of the electronic assembly.

21. The method according to claim 10 wherein said insulating matrix provides structural support to said conductive adhesive within said plurality of conductor holes in said insulating matrix.

22. The method according to claim 10 wherein said solid conductive material comprises a solid conductive metal material.

23. The method according to claim 22 wherein said solid conductive metal material comprises a metal selected from the group consisting of copper, brass, nickel, tin, gold, lead, and combinations thereof.

24. The method according to claim 10 wherein said solid conductive material is attached to said conductive adhesive whereby a portion of said solid conductive material is provided within said plurality of conductor holes.

25. The method according to claim 24 wherein said solid conductive material is attached to said conductive adhesive such that a portion of about 25% to about 75% of said solid conductive material is provided within said plurality of conductor holes.

26. The method according to claim 10 wherein said solid conductive material comprises a contact selected from the group consisting of a pin, cone, stud, ball, and disk.

27. The method according to claim 10 wherein said insulating matrix having said solid conductive material attached to said conductive material within said plurality of conductor holes is permanently attached to said first substrate.

28. The method according to claim 10 wherein said second substrate is attached to said solid conductive material by said attachment means by said solid conductive material is connected to contact arrays on a surface of said second substrate to form said electronic assembly.

29. The method according to claim 10 wherein said attachment means comprises a solder.

* * * * *